(12) United States Patent
Tokunaga et al.

(10) Patent No.: US 8,018,445 B2
(45) Date of Patent: Sep. 13, 2011

(54) SERIAL DATA INPUT SYSTEM

(75) Inventors: Tetsuya Tokunaga, Gunma (JP);
 Hiroyuki Arai, Gunma (JP); Takeshi Kimura, Tochigi (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 755 days.

(21) Appl. No.: 11/542,640

(22) Filed: Oct. 4, 2006

(65) Prior Publication Data
 US 2007/0101028 A1 May 3, 2007

(30) Foreign Application Priority Data
 Oct. 6, 2005 (JP) ................. 2005-293478

(51) Int. Cl.
 *G09G 5/00* (2006.01)
 *G06F 3/038* (2006.01)
(52) U.S. Cl. .............. 345/204; 345/98; 377/64
(58) Field of Classification Search .......... 345/204–213, 345/690–699, 87–102, 76–83, 60, 55; 710/52; 377/64, 70, 77, 80
 See application file for complete search history.

(56) References Cited

U.S. PATENT DOCUMENTS

| | | | | | |
|---|---|---|---|---|---|
| 3,684,829 | A | * | 8/1972 | Patterson | 341/138 |
| 4,168,488 | A | * | 9/1979 | Evans | 382/297 |
| 4,180,813 | A | * | 12/1979 | Yoneda | 345/100 |
| 4,745,577 | A | * | 5/1988 | Ogawa et al. | 365/78 |
| 5,455,598 | A | * | 10/1995 | Clerc | 345/94 |
| 5,740,083 | A | * | 4/1998 | Anderson et al. | 702/148 |
| 2003/0090500 | A1 | * | 5/2003 | Yamazaki | 345/690 |

FOREIGN PATENT DOCUMENTS

| | | |
|---|---|---|
| JP | 2005-094694 | 4/2005 |
| KR | 1998-035115 | 8/1998 |

* cited by examiner

*Primary Examiner* — Stephen Sherman
(74) *Attorney, Agent, or Firm* — Morrison & Foerster LLP (57) ABSTRACT

Increase in power consumption and increase in power supply noise of a serial data input system are suppressed, while clock skew is more easily prevented. The serial data input system of this invention includes a shift register that takes in and shifts serially transferred display data in synchronization with a clock SCL, a clock counter that counts the number of clock pulses of the clock SCL and outputs each of clock count signals BIT08, BIT16 and BIT24 when the counted number of the clock pulses of the clock SCL reaches each of count numbers 8, 16 and 24 respectively, and registers into each of which the data stored in the shift register is transferred and stored collectively and in parallel in response to each of the clock count signals BIT08, BIP16 and BIT24 respectively.

8 Claims, 13 Drawing Sheets

SERIAL DATA INPUT SYSTEM

CROSS-REFERENCE OF THE INVENTION

This application claims priority from Japanese Patent Application No. 2005-293478, the content of which is incorporated herein by reference in its entirety.

BACKGROUND OF THE INVENTION

1. Field of the Invention

This invention relates to a serial data input system that receives and stores data serially transferred from an external circuit.

2. Description of the Related Art

Figure 12:
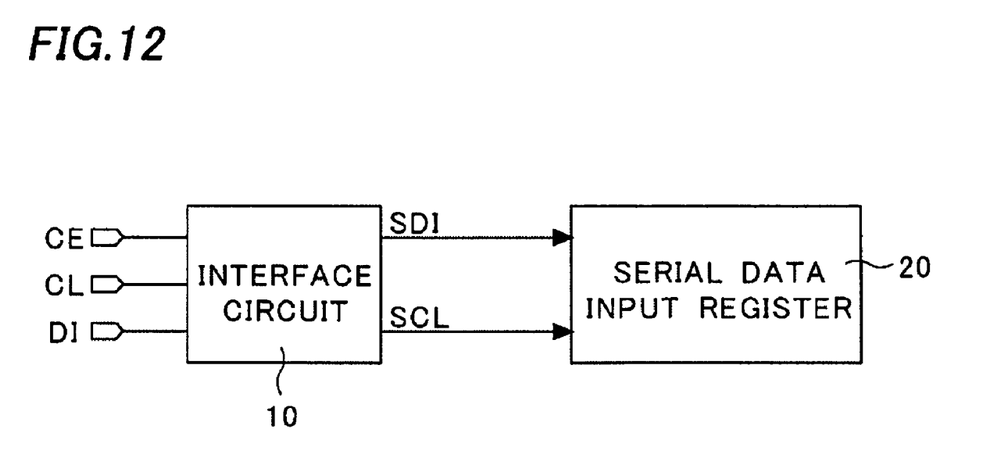
FIG. 12 is a block diagram showing a serial data input system according to a prior art.

Conventionally, a digital camera and the like are provided with a serial data input system that receives and stores display data serially transferred from an external circuit such as a microcomputer. FIG. 12 is a block diagram showing such a serial data input system. The serial data input system has an interface circuit 10 and a serial data input register 20.

A clock CL, a chip enable signal CE and data DI (display data SDI and 8-bit address data A0-A7 that is serially transferred ahead of the display data SDI in synchronization with the clock CL) serially transferred from a microcomputer are inputted to the interface circuit 10.

And the interface circuit 10 outputs the display data SDI and the clock CL without modification only when the address data A0-A7 coincides with inherent IC address data that has been stored in the interface circuit 10 in advance. The clock CL outputted from the interface circuit 10 is hereafter referred to as a clock SCL.

Figure 13:
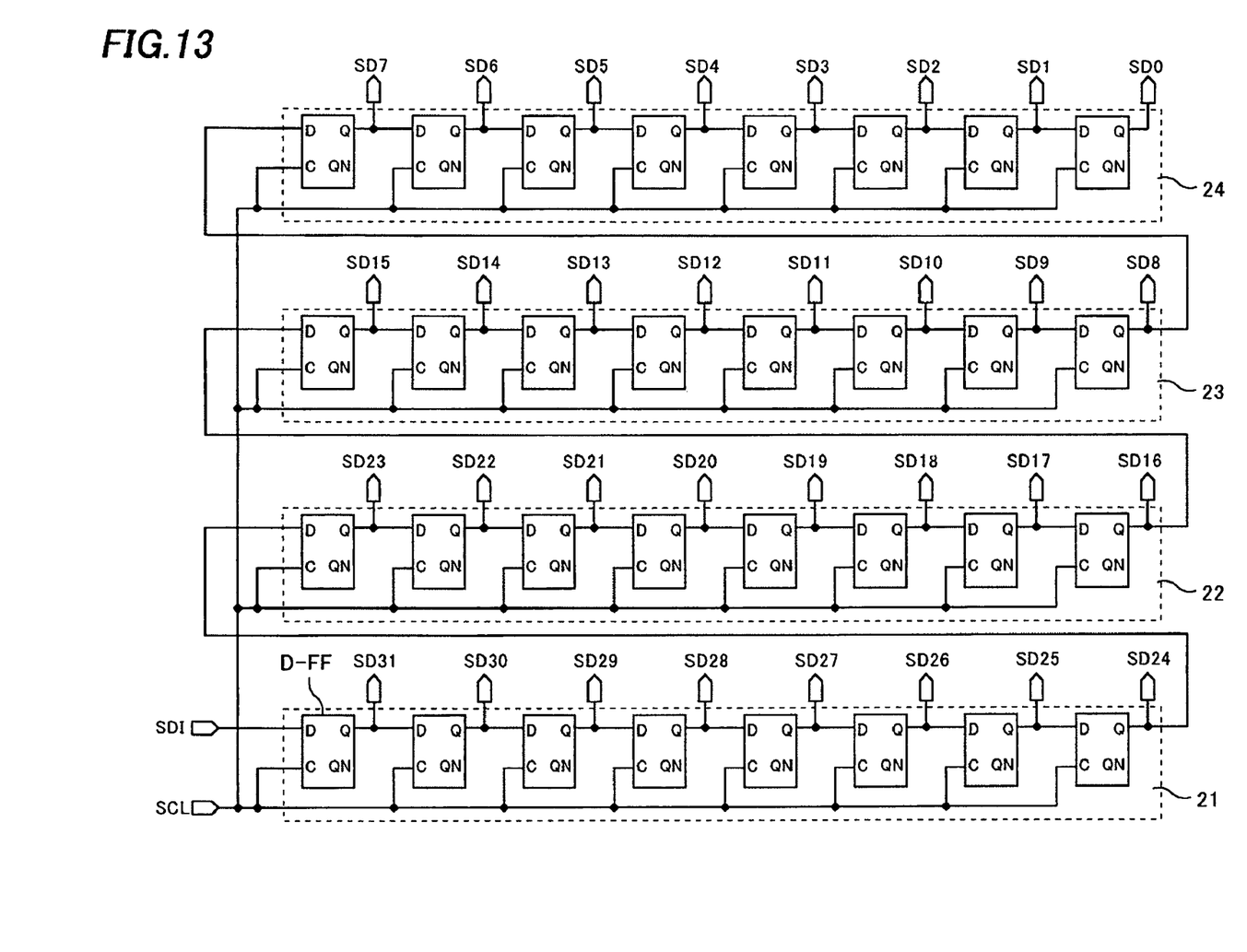
FIG. 13 is a circuit diagram of a serial data input register shown in FIG. 12.

The display data SDI is inputted to and shifted in the serial data input register 20 in synchronization with the clock SCL that is outputted from the interface circuit 10. The serial data input register 20 is composed of a group of serially connected four shift registers 21, 22, 23 and 24, each composed of eight D-FF circuits (Delay Flip-Flop circuits), as shown in FIG. 13. The clock SCL is applied to all of the D-FF circuits.

Figure 14:
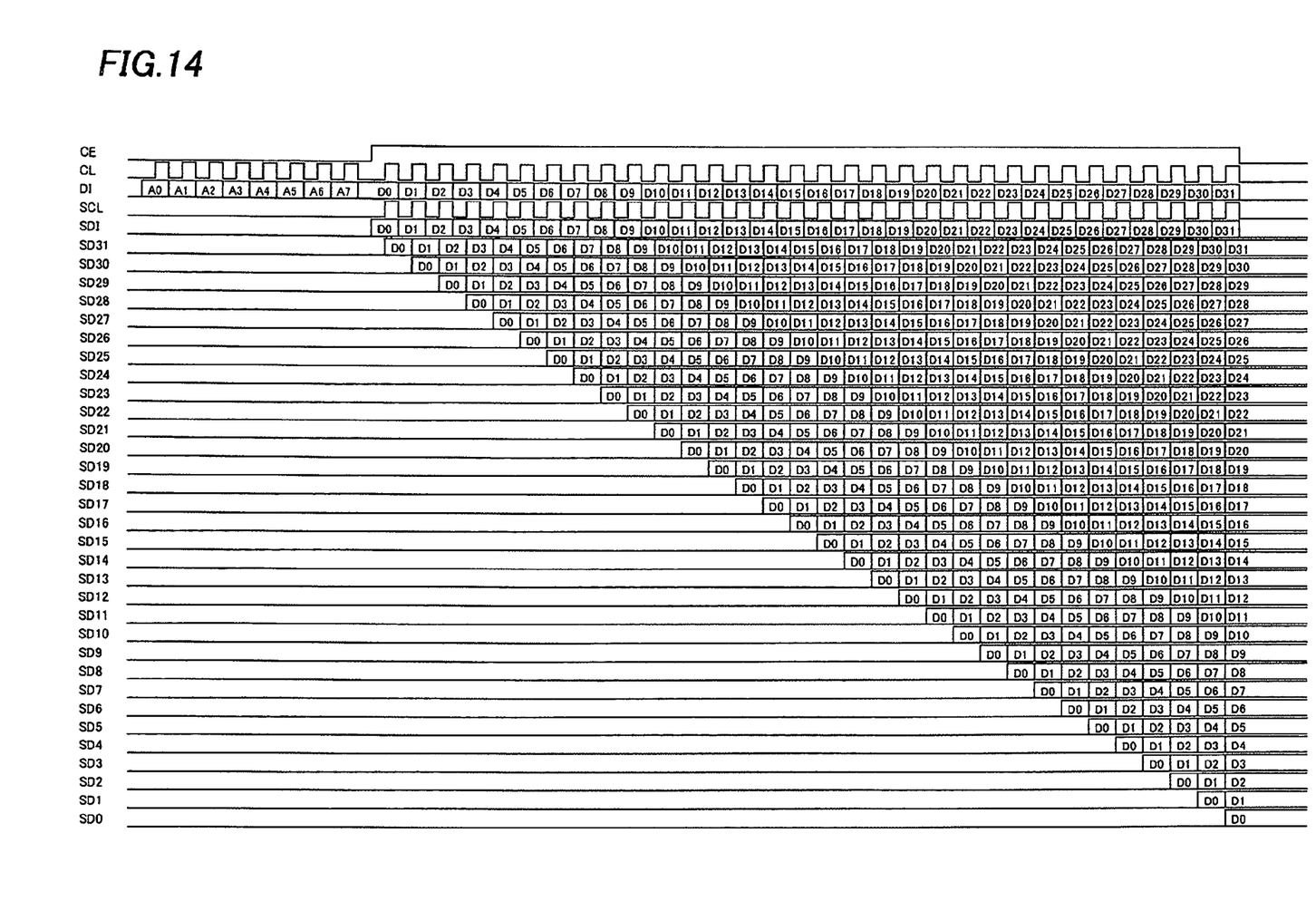
FIG. 14 is a timing chart showing an operation of the serial data input system according to the prior art.

An operation of the serial data input system described above will be explained hereinafter referring to a timing chart shown in FIG. 14. When the address data A0-A7 transferred from the microcomputer coincides with the inherent IC address data and the chip enable signal CE rises to a high level, the interface circuit 10 outputs the clock SCL and 32 bits of the display data D0-D31 are inputted to and sequentially shifted in the group of shift registers 21-24 in the serial data input register 20 in synchronization with a rising edge of each clock pulse of the clock SCL. Each of output data SD31-SD0 is retained at a Q terminal of corresponding each of the D-FF circuits that constitute the group of shift registers 21-24. The 32 bits of display data D0-D31 are inputted to the serial data input register 20 as described above. Technologies related to the interface circuit 10 are disclosed in Japanese Patent Application Publication No. 2005-94694.

In the serial data input register 20, however, a through-current for re-writing the data flows in every D-FF circuit at every clock pulse of the clock SCL when the display data D0-D31 is serially inputted, since the group of four shift registers 21, 22, 23 and 24 are serially connected and the clock SCL is applied to all of the D-FF circuits. Therefore, the more number of bits (the number of the D-FF circuits) are in the serial data input register 20, the more through-current flows between the power supply and the ground in each of the D-FF circuit, causing a problem that the power consumption in the whole system increases as a result. Also, a lot of effort is required to meet EMC (Electromagnetic Compatibility) requirements, since a power supply noise increases as the through-current increases.

In addition, since the number of D-FF circuits disposed in the IC chip as well as wirings connecting between the D-FF circuits increase as the number of bits in the serial data input register 20 increases, a difference in delay time of the clock SCL, or a clock skew, becomes more likely to be caused between D-FF circuits, thus malfunctioning of the D-FF circuits may be caused. Therefore, a lot of time and effort are required to prevent the clock skew.

SUMMARY OF THE INVENTION

This invention provides a serial data input system including a first register that shifts serially transferred data in synchronization with a clock, a clock counter that counts the number of clock pulses of the clock and outputs a first clock count signal when the counted number of clock pulses reaches a first count number, and a second register that takes in and stores the data stored in the first register collectively and in parallel in response to the first clock count signal.

DETAILED DESCRIPTION OF THE INVENTION

Figure 1:
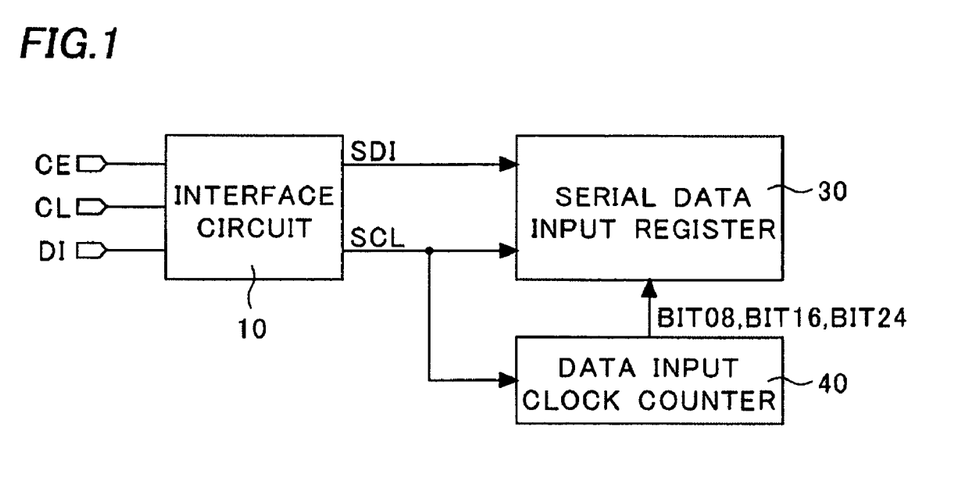
FIG. 1 is a block diagram of a serial data input system according to a first embodiment of this invention.

A serial data input system according to a first embodiment of this invention will be explained hereafter. FIG. 1 is a block diagram showing the serial data input system. The serial data input system is provided with an interface circuit 10, a serial data input register 30 and a data input clock counter 40.

A clock CL, a chip enable signal CE and data DI (display data SDI and 8-bit address data A0-A7 that is serially transferred ahead of the display data SDI in synchronization with the clock CL) serially transferred from a microcomputer are inputted to the interface circuit 10 that is basically identical to the interface circuit 10 in the prior art shown in FIG. 12. And the interface circuit 10 outputs the display data SDI and the clock CL without modification only when the address data A0-A7 coincides with inherent IC address data that has been stored in the interface circuit 10 in advance. The clock CL outputted from the interface circuit 10 is hereafter referred to as a clock SCL.

Figure 2:
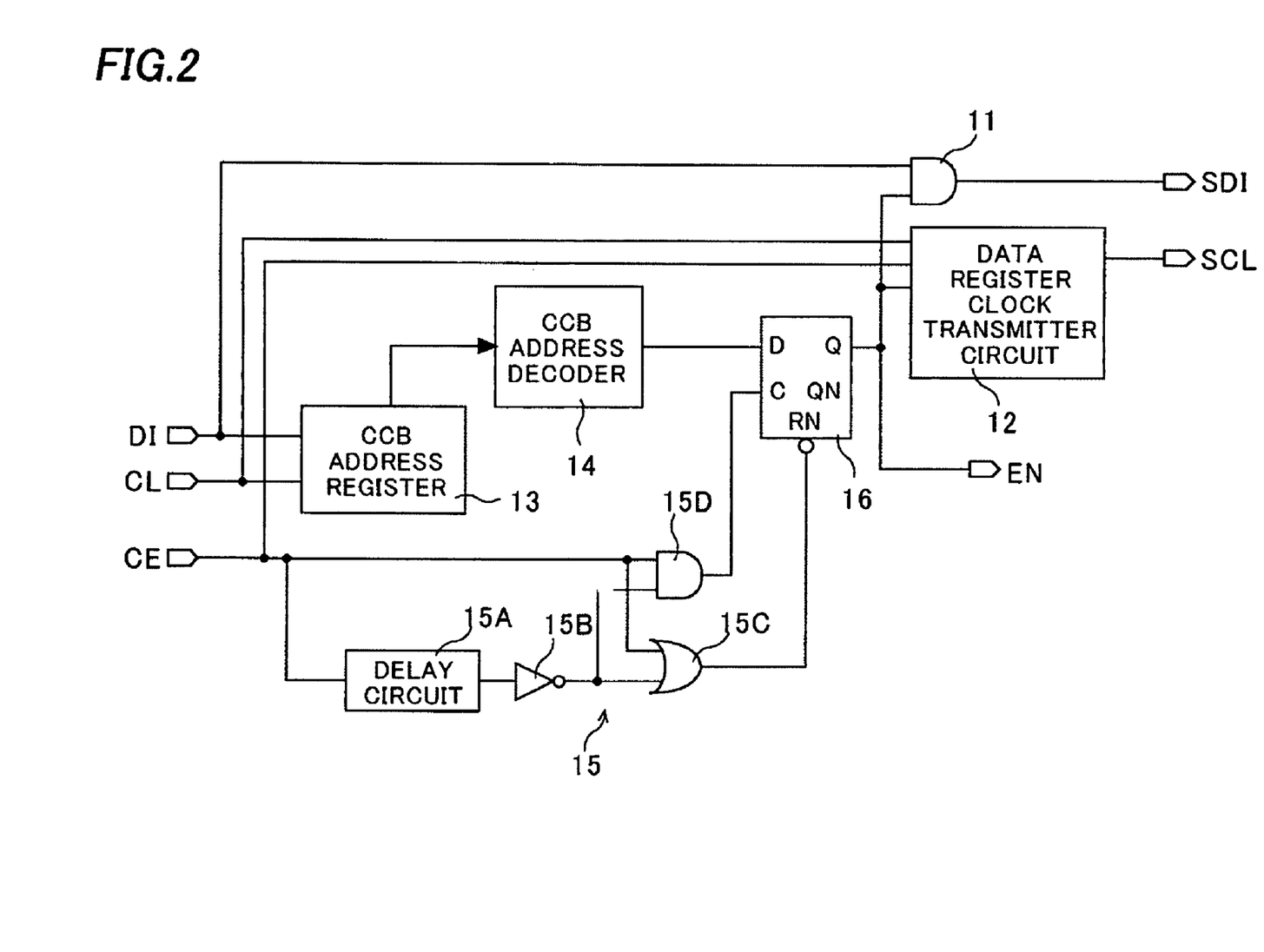
FIG. 2 is a circuit diagram of an interface circuit shown in FIG. 1.

A concrete circuit structure of the interface circuit 10 includes a CCB (Computer Control Bus) address register 13 that takes in and stores the address data A0-A7 serially transferred in synchronization with the clock SCL, a CCB address decoder 14 that decodes the address data A0-A7 stored in the CCB address register 13, verifies that the decoded address data A0-A7 coincides with the inherent IC address data pre-assigned to the IC and generates an address verify signal that is turned to a high level when verified, a chip enable detection circuit 15 that detects a rise and a fall of the chip enable signal CE, an address verify signal register 16 made of a flip-flop that takes in and stores the address verify signal in synchronization with the rise of the chip enable signal CE and is reset in synchronization with the fall of the chip enable signal CE, an AND circuit 11 to which the data DI and an output signal of the address verify signal register 16 are inputted and a data register clock transmitter circuit 12 to which the chip enable signal CE, the clock CL and the output signal of the address verify signal register 16 are inputted, as shown in FIG. 2.

The chip enable detection circuit 15 is made of a delay circuit 15A that delays the chip enable signal CE, an inverter 15B that inverts an output of the delay circuit 15A and an OR circuit 15C and an AND circuit 15D to each of which the chip enable signal CE and an output of the inverter 15B are inputted. According to the interface circuit 10 described above, when the output signal of the address verify signal register 16 is turned to the high level, the display data SDI is outputted through the AND circuit 11 and the clock SCL is outputted through the data register clock transmitter circuit 12.

And the data input clock counter 40 counts the number of clock pulses of the clock SCL and outputs clock count signals (pulse signals) BIT08, BIT16 and BIT24 when the number reaches predetermined count numbers, 8, 16 and 24, for example.

Figure 3:
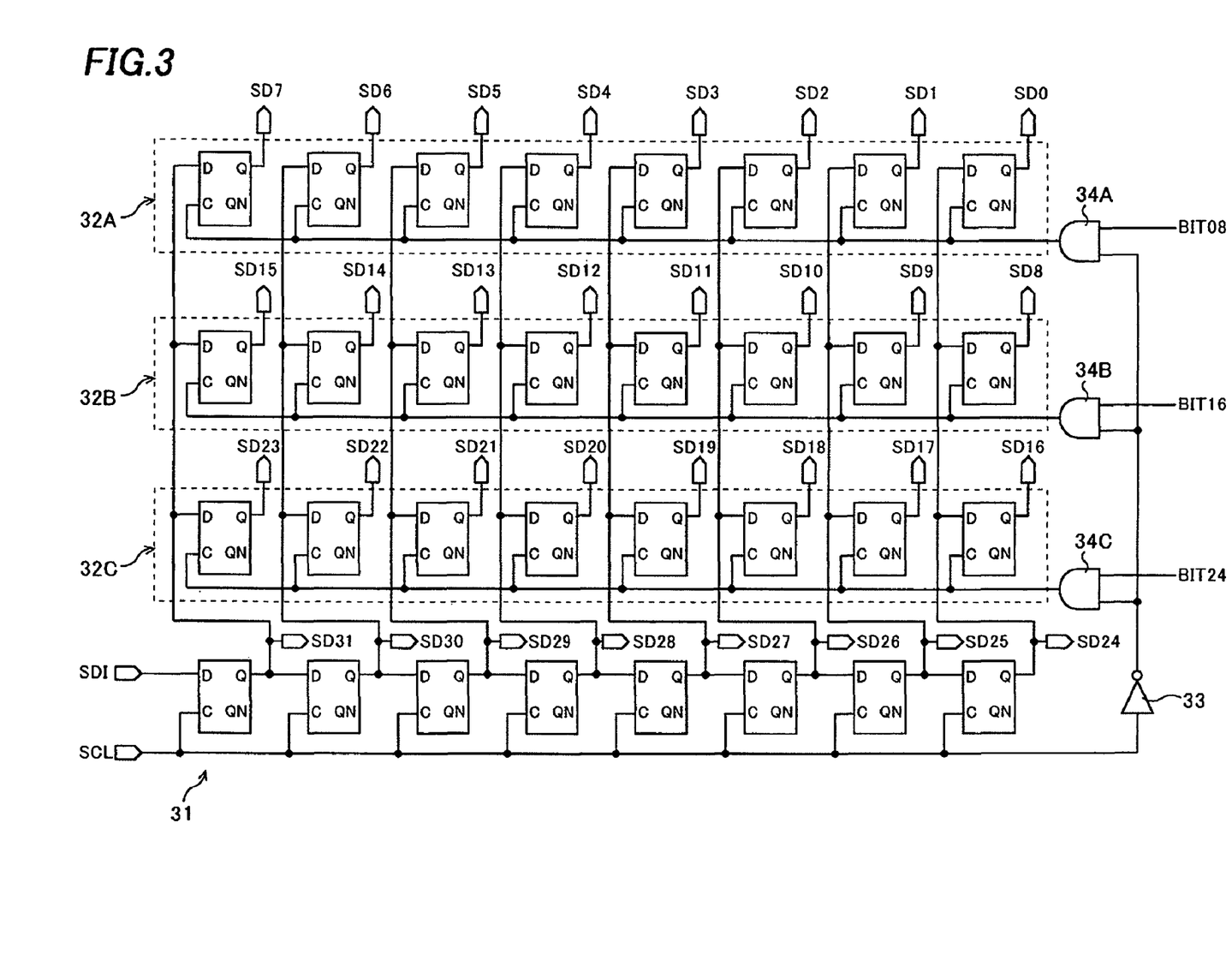
FIG. 3 is a circuit diagram of a serial data input register shown in FIG. 1.

The clock SCL, the display data SDI and the clock count signals BIT08, BIT16 and BIT24 outputted from the data input clock counter 40 are inputted to the serial data input register 30. As shown in FIG. 3, a concrete circuit structure of the serial data input register 30 includes an 8-bit shift register (a first register) 31 that shifts serially transferred data in synchronization with the clock SCL and registers (second registers) 32A, 32B and 32C, into each of which eight bits of the display data stored in the shift register 31 are transferred and stored collectively and in parallel in response to each of the clock count signals (pulse signals) BIT08, BIT16 and BIT24, respectively. That is, the serial input register 30 is made of 32-bit register divided into four 8-bit registers, that is, the shift register 31 (made of D-FF circuits that output data SD31 -SD24) that can receive up to 8 bits of the display data SDI in response to the clock SCL, the register 32A (made of D-FF circuits that output data SD7-SD0) that can collectively take in and store the display data D0-D7 stored in the shift register 31 when the counted number of the clock pulses of the clock SCL reaches eight, the register 32B (made of D-FF circuits that output data SD15-SD8) that can collectively take in and store the display data D8-D15 stored in the shift register 31 when the counted number of the clock pulses of the clock SCL reaches 16, and the register 32C (made of D-FF circuits that output data SD23-SD16) that can collectively take in and store the display data D16-D23 stored in the shift register 31 when the counted number of the clock pulses of the clock SCL reaches 24.

In order to enable the collective transfer of the display data from the shift register 31 to each of the registers 32A, 32B and 32C, the clock SCL is inverted by an inverter 33 and inputted to each of AND circuits 34A, 34B and 34C, while the clock count signal BIT08 is inputted to the AND circuit 34A, the clock count signal BIT16 is inputted to the AND circuit 34B and the clock count signal BIT24 is inputted to the AND circuit 34C.

An output of the AND circuit 34A is inputted to a clock input terminal C of each of the D-FF circuits in the register 32A, an output of the AND circuit 34B is inputted to a clock input terminal C of each of the D-FF circuits in the register 32B, and an output of the AND circuit 34C is inputted to a clock input terminal of each of the D-FF circuits in the register 32C. As a result, the display data stored in the shift register 31 is collectively transferred to one of the registers 32A, 32B and 32C depending on the counted number of clock pulses of the clock SCL, after the display data stored in the shift register 31 is established.

Figure 4:
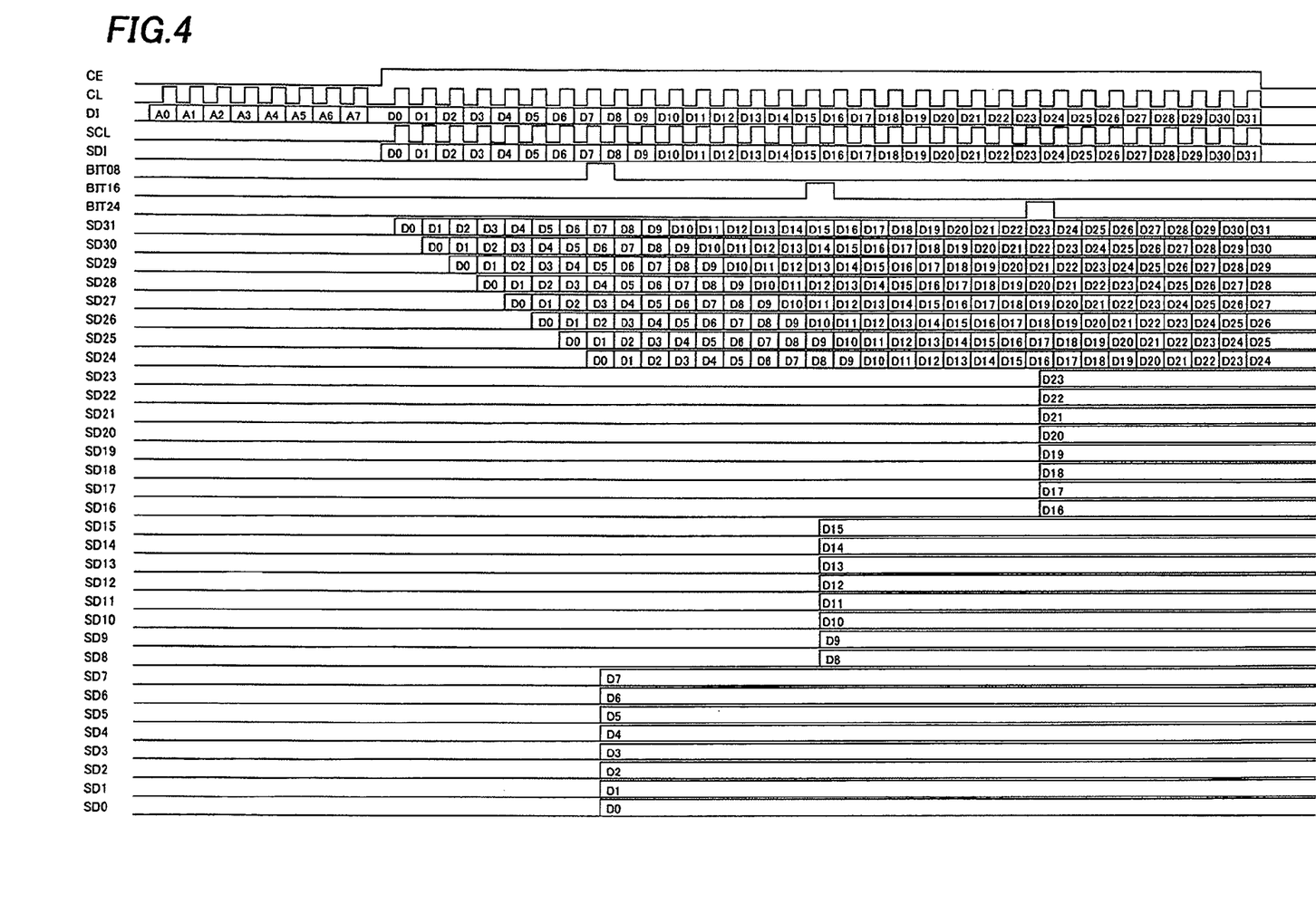
FIG. 4 is a timing chart showing an operation of the serial data input system according to the first embodiment of this invention.

Next, an operation of the serial data input system described above will be explained hereinafter referring to a timing chart shown in FIG. 4. When the address data A0-A7 transferred from the microcomputer coincides with the inherent IC address data and the chip enable signal CE rises to a high level, the interface circuit 10 outputs the clock SCL and 32 bits of the display data D0-D31 are inputted to the serial data input register 30 in synchronization with a rising edge of the clock pulse of the clock SCL.

First, the display data D0-D7 is inputted to the shift register 31 in synchronization with the rising edge of the clock pulse of the clock SCL. When the counted number of the clock pulses of the clock SCL reaches eight, the clock count signal BIT08 turns to the high level and the display data D0-D7 is collectively transferred to and stored in the register 32A in synchronization with a falling edge of the clock pulse of the clock SCL. Next, the display data D8-D15 is inputted to the shift register 31. When the counted number of the clock pulses of the clock SCL reaches 16, the clock count signal BIT16 turns to the high level and the display data D8-D15 is collectively transferred to and stored in the register 32B in synchronization with the falling edge of the clock pulse of the clock SCL. Following the above, the display data D16-D23 is inputted to the shift register 31. When the counted number of the clock pulses of the clock SCL reaches 24, the clock count signal BIT24 turns to the high level and the display data D16-D23 is collectively transferred to and stored in the register 32C in synchronization with the falling edge of the clock pulse of the clock SCL. And finally, the display data D24-D31 is inputted to the shift register 31.

Preventing the clock skew, as well as suppressing the increase in the power consumption and the increase in the power supply noise, can be easily implemented with the serial data input system according to the embodiment of this invention, because only the shift register 31 out of all the registers in the serial data input register 30 fully operates in synchronization with the clock SCL, reducing the number of fully operating D-FF circuits in synchronization with the clock SCL to 8, or ¼ of the total number (32) of D-FF circuits which fully operate in synchronization with the clock SCL in the prior art. Not only the display data but also control data that controls the display, for example, may be inputted to the serial data input system. Also, the number of bits in the shift register 31 and in each of the registers 32A, 32B and 32C may be increased or reduced as required.

Figure 5:
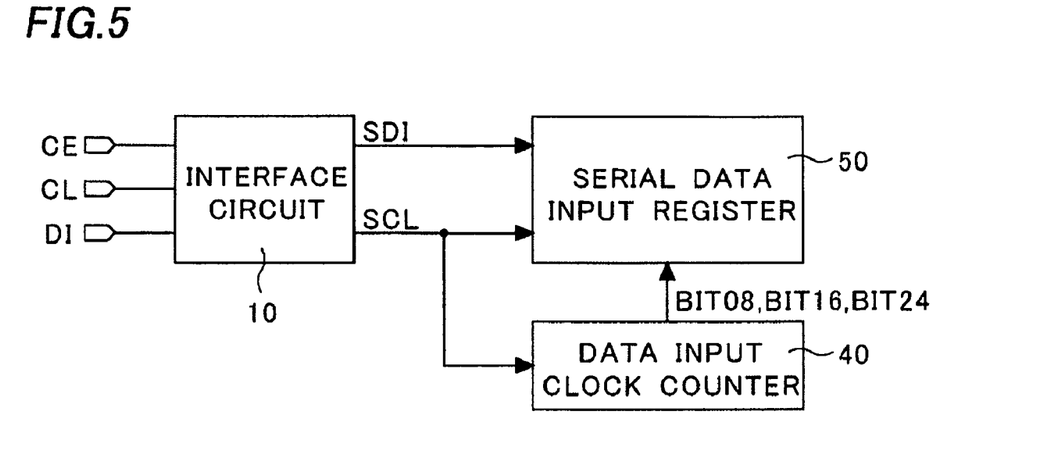
FIG. 5 is a block diagram of a serial data input system according to a second embodiment of this invention.

Next, a serial data input system according to a second embodiment of this invention will be explained hereafter. FIG. 5 is a block diagram showing the serial data input system. What is different from the first embodiment is a circuit structure of a serial data input register 50.

Figure 6:
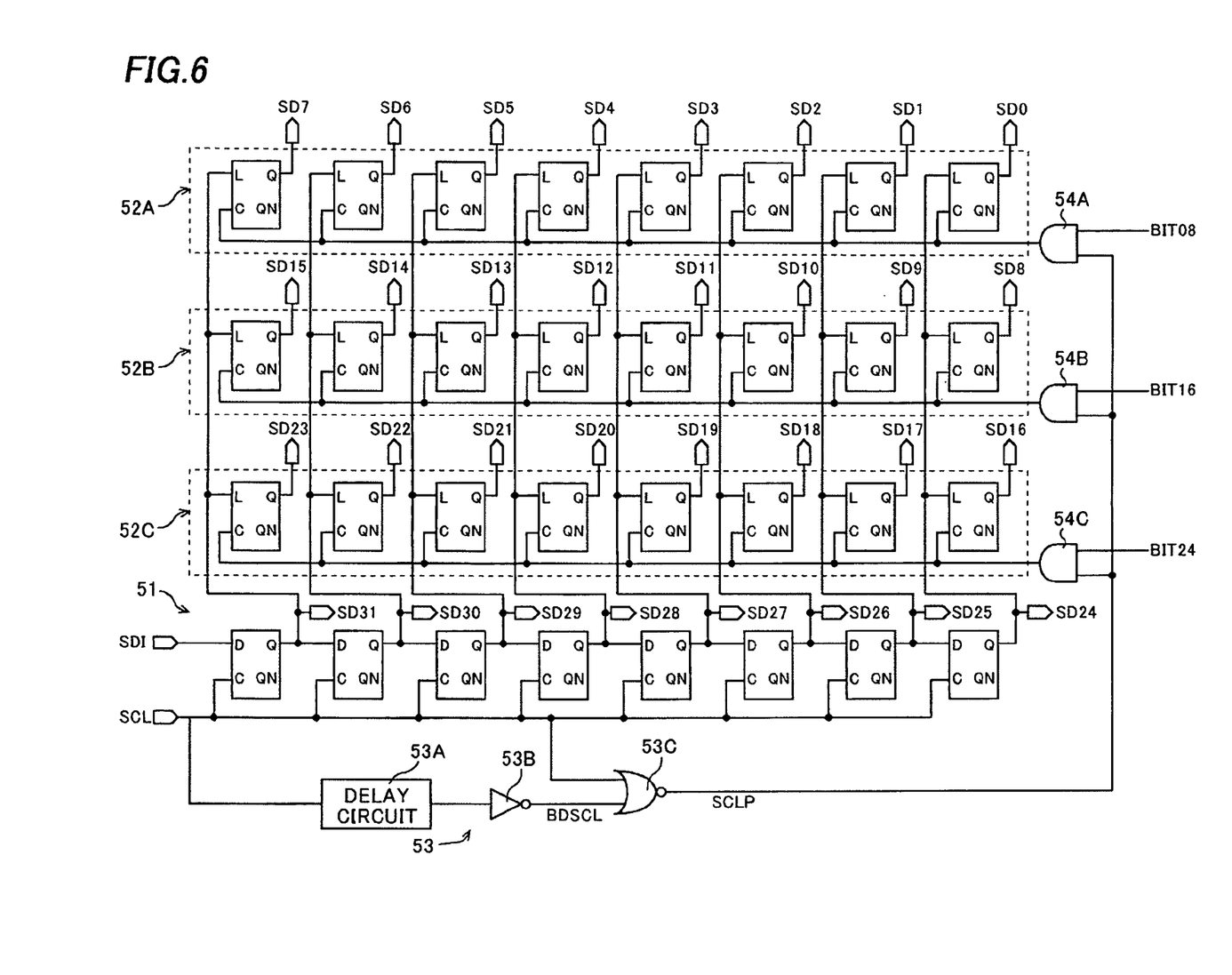
FIG. 6 is a circuit diagram of a serial data input register shown in FIG. 5.

As shown in FIG. 6, the serial data input register 50 is provided with an 8-bit shift register (a first register) 51 that shifts serially transferred data in synchronization with the clock SCL and registers (second registers) 52A, 52B and 52C composed of latch circuits, into each of which eight bits of display data stored in the shift register 31 are transferred and stored collectively and in parallel in response to each of the clock count signals (pulse signals) BIT08, BIT16 and BIT24, respectively. In other words, the registers 32A, 32B and 32C composed of the D-FF circuits in the first embodiment are replaced with the registers 52A, 52B and 52C composed of the latch circuits in the second embodiment.

In order to enable the collective transfer of the display data from the shift register 51 to each of the registers 52A, 52B and 52C, a latch pulse signal SCLP from a latch pulse generation circuit 53 is inputted to each of AND circuits 54A, 54B and 54C, while a clock count signal BIT08 is inputted to the AND circuit 54A, a clock count signal BIT16 is inputted to the AND circuit 54B and a clock count signal BIT24 is inputted to the AND circuit 54C. The latch pulse generation circuit 53 generates the latch pulse signal SCLP that is synchronized with the fall of the clock pulse of the clock SCL, and is composed of a delay circuit 53A that delays the clock SCL, an inverter 53B that inverts an output of the delay circuit 53A and a NOR circuit 53C to which the clock SCL and an output of the inverter 53B are inputted.

Figure 7:
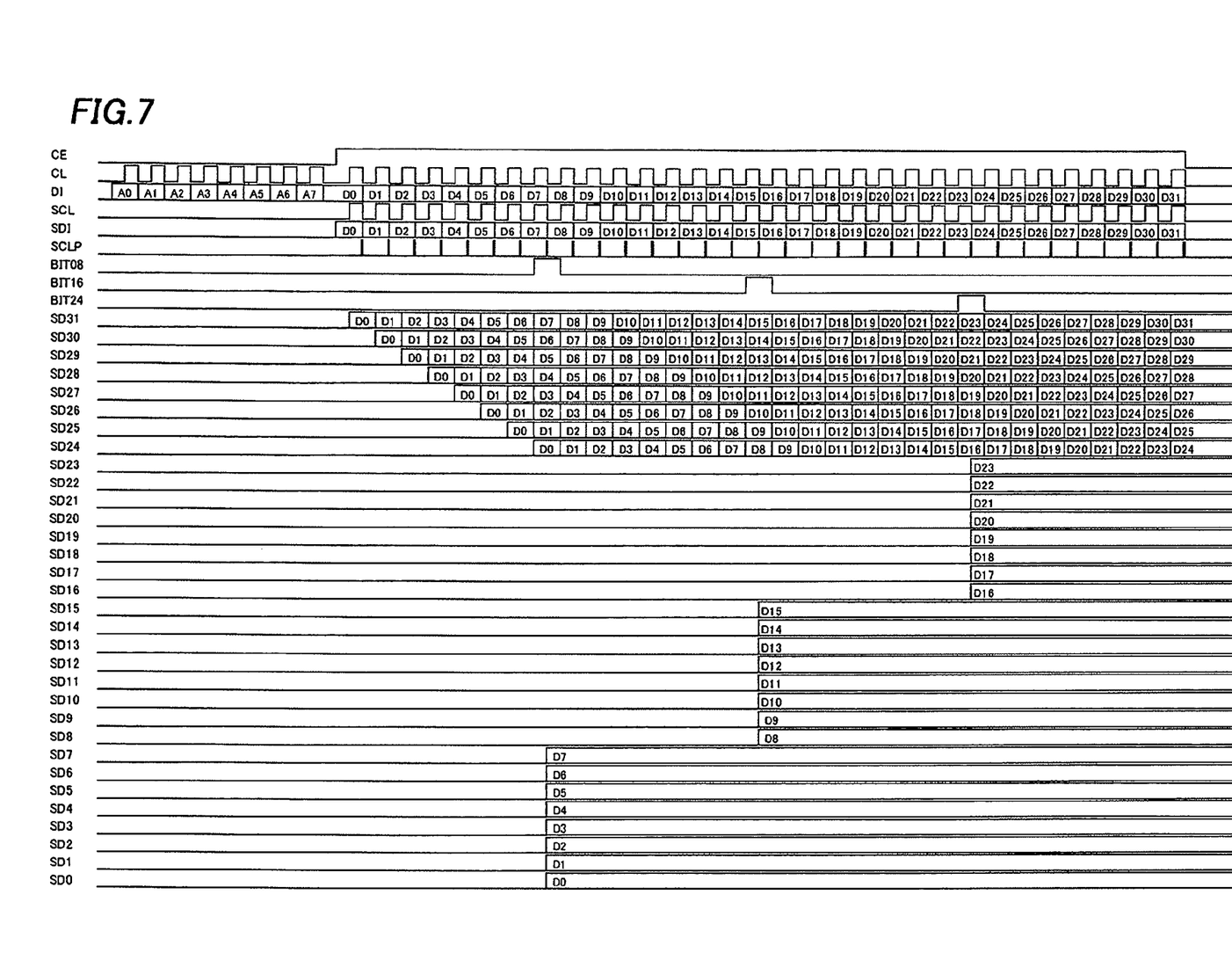
FIG. 7 is a timing chart showing an operation of the serial data input system according to the second embodiment of this invention.

Next, an operation of the serial data input system described above will be explained hereinafter referring to a timing chart shown in FIG. 7. When address data A0-A7 transferred from a microcomputer coincides with inherent IC address data and a chip enable signal CE rises to a high level, an interface circuit 10 outputs the clock SCL and 32 bits of display data D0-D31 are inputted to the serial data input register 50 in synchronization with a rising edge of a clock pulse of the clock SCL.

First, the display data D0-D7 is inputted to the shift register 51 in synchronization with the rising edge of the clock pulse of the clock SCL. When the counted number of the clock pulses of the clock SCL reaches eight, the clock count signal BIT08 turns to the high level and the display data D0-D7 is collectively transferred to and stored in the register 52A in synchronization with the latch pulse signal SCLP. Next, the display data D8-D15 is inputted to the shift register 51. When the counted number of the clock pulses of the clock SCL reaches 16, the clock count signal BIT16 turns to the high level and the display data D8-D15 is collectively transferred to and stored in the register 52B in synchronization with the latch pulse SCLP. Following the above, the display data D16-D23 is inputted to the shift register 51. When the counted number of the clock pulses of the clock SCL reaches 24, the clock count signal BIT24 turns to the high level and the display data D16-D24 is collectively transferred and stored in the register 52C in synchronization with the latch pulse SCLP. And finally, the display data D24-D31 is inputted to the shift register 51.

The serial data input system according to the second embodiment is more suitable to a case in which the clock SCL is of low frequency compared with the serial data input system according to the first embodiment, because the display data in the shift register 51 is latched based on the latch pulse signal SCLP that is generated from the clock SCL. Preventing the clock skew, as well as suppressing the increase in the power consumption and the increase in the power supply noise, can be easily implemented with the serial data input system according to the second embodiment, as with the serial data input system according to the first embodiment.

An advantage of the second embodiment is that the circuit can be reduced in size, because the registers 52A, 52B and 52C are composed of the latch circuits instead of the D-FF circuits. Not only the display data but also control data that controls the display, for example, may be inputted to the serial data input system. Also, the number of bits in the shift register 51 and in each of the registers 52A, 52B and 52C may be increased or reduced as required.

Next, a serial data input system according to a third embodiment of this invention will be explained hereafter. A serial data input register is followed by registers to store sequentially transferred data, which are composed of D-FF circuits, latch circuits, memories or the like. For example, there are included a display data register that controls turning on/off of a display and a control data register that controls operation mode (an on/off selection of an oscillation circuit, a selection of display driving method, etc.) of a display driver IC. The serial data input system according to the third embodiment is provided with the display data register and the control data register.

Figure 8:
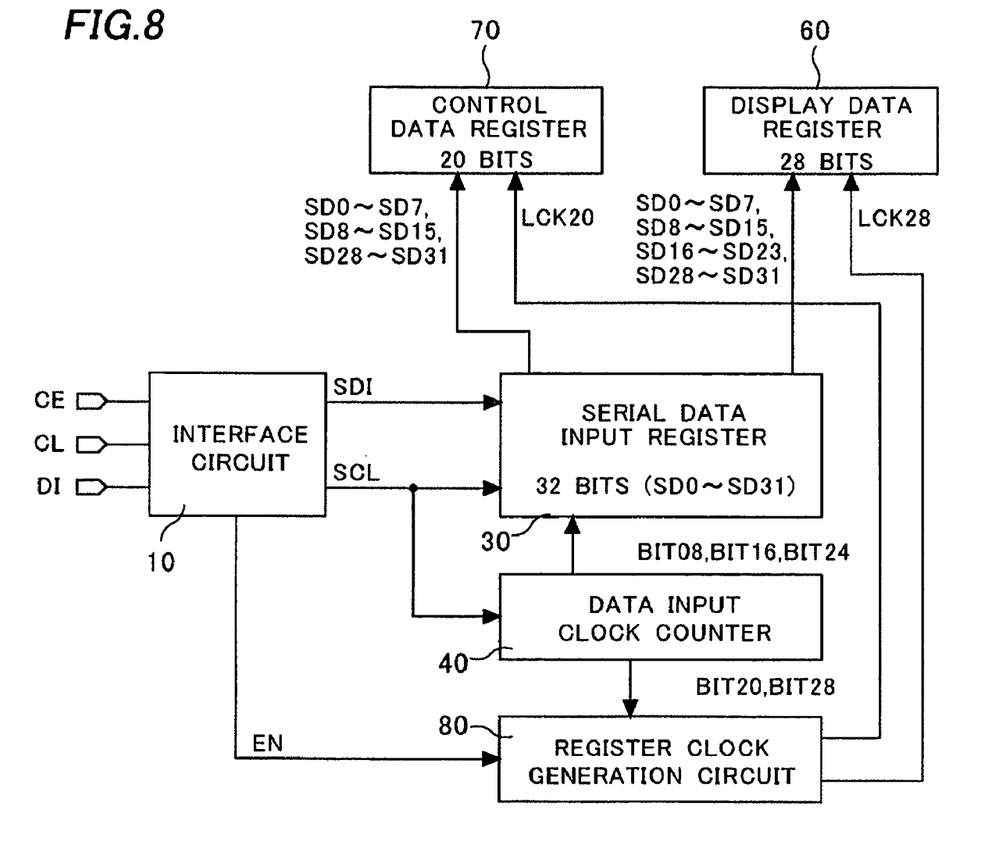
FIG. 8 is a block diagram of a serial data input system according to a third embodiment of this invention.

As shown in FIG. 8, the serial data input system of the third embodiment includes a display data register 60 of 28 bits, a control data register 70 of 20 bits and a register clock generation circuit 80 that generates clock signals LCK28 and LCK20 which are used to transfer the display data or the like from a serial data input register 30 to the display data register 60 and the control data register 70, in addition to the serial data input system of the first embodiment shown in FIG. 1.

Figure 9:
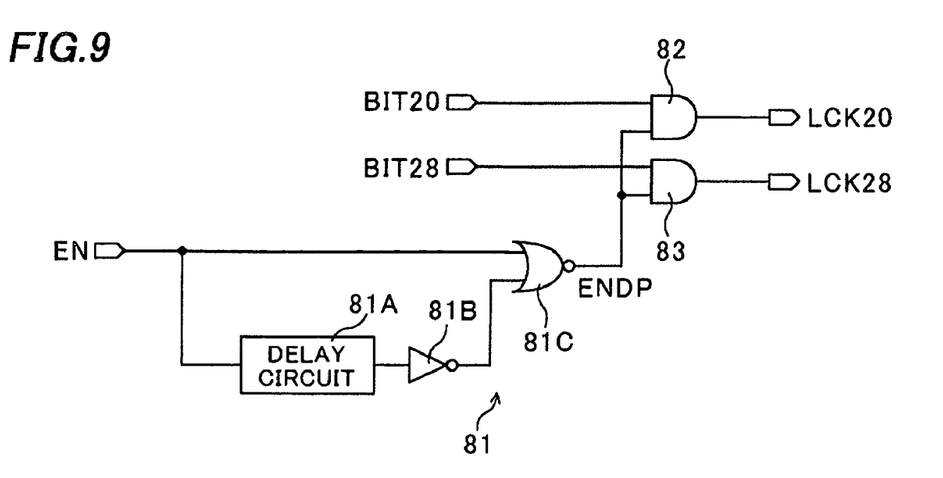
FIG. 9 is a circuit diagram of a register clock generation circuit shown in FIG. 8.

The register clock generation circuit 80 is provided with a pulse generation circuit 81 that generates a pulse signal ENDP synchronized with a fall of an enable signal EN, an AND circuit 82 to which a clock count signal (pulse signal) BIT20 and the pulse signal ENDP are inputted and an AND circuit 83 to which a clock count signal (pulse signal) BIT28 and the pulse signal ENDP are inputted, as shown in FIG. 9. Each of the AND circuits 82 and 83 outputs each of the register clock signals LCK20 and LCK28, respectively.

The enable signal EN means the output signal of the address verify signal register 16 (Refer to FIG. 2.). The clock count signal BIT20 is outputted from the data input clock counter 40 when the counted number of the clock pulses of the clock SCL reaches 20, and the clock count signal BIT28 is outputted from the data input clock counter 40 when the counted number of the clock pulses of the clock SCL reaches 28. The pulse generation circuit 81 is composed of a delay circuit 81A that delays the enable signal EN, an inverter 81B that inverts an output of the delay circuit 81A and a NOR circuit 81C to which an output of the inverter 81B and the enable signal EN are inputted.

Figure 10:
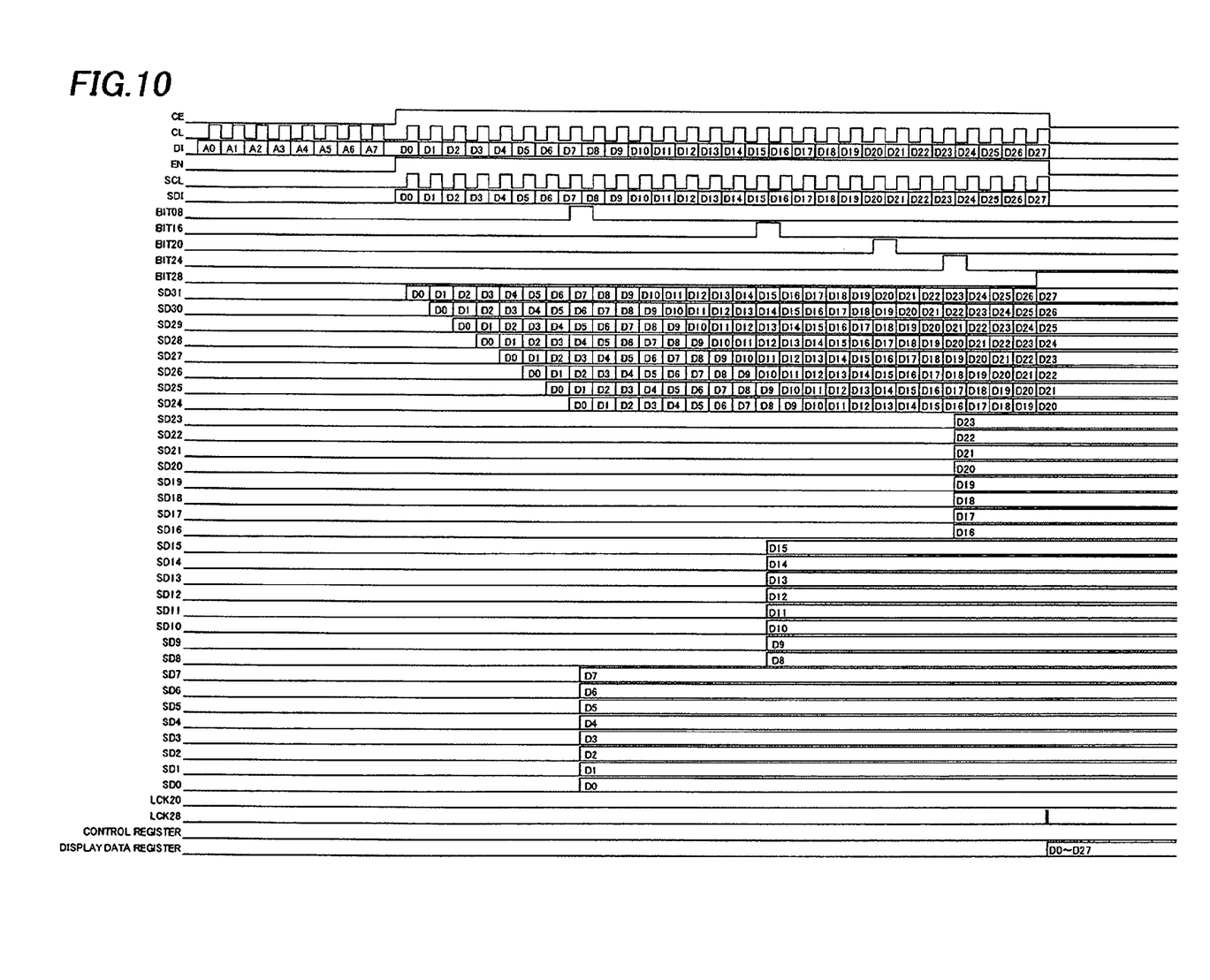
FIG. 10 is a timing chart showing a first operation of the serial data input system according to the third embodiment of this invention.

Next, an operation of the serial data input system described above, in which 28 bits of the display data stored in the serial data input register 30 are transferred and stored into the display data register 60, will be explained referring to a timing chart shown in FIG. 10. When the address data A0-A7 transferred from the microcomputer coincides with the inherent IC address data and the chip enable signal CE rises to a high level, the interface circuit 10 outputs the clock SCL and 28 bits of the display data D0-D27 are inputted to the serial data input register 30 in synchronization with a rise of the clock pulse of the clock SCL.

First, the display data D0-D7 is inputted to the shift register 31 in synchronization with the rise of the clock pulse of the clock SCL. When the counted number of the clock pulses of the clock SCL reaches eight, the clock count signal BIT08 turns to the high level and the display data D0-D7 is collectively transferred to and stored in the register 32A in synchronization with a fall of the clock pulse of the clock SCL. Next, the display data D8-D15 is inputted to the shift register 31. When the counted number of the clock pulses of the clock SCL reaches 16, the clock count signal BIT16 turns to the high level and the display data D8-D15 is collectively transferred to and stored in the register 32B in synchronization with the fall of the clock pulse of the clock SCL. Following the above, the display data D16-D23 is inputted to the shift register 31. When the counted number of the clock pulses of the clock SCL reaches 24, the clock count signal BIT24 turns to the high level and the display data D16-D23 is collectively transferred to and stored in the register 32C in synchronization with the fall of the clock pulse of the clock SCL. And finally, the display data D24-D27 is inputted to the shift register 31.

Because the counted number of the clock pulses of the clock SCL reaches 28 when all 28 bits of the display data are inputted to the serial data input register 30 as described above, the clock count signal BIT28 turns to the high level and the display data D0-D7 stored in the register 32A, the display data D8-D15 stored in the register 32B, the display data D16-D23 stored in the register 32C and the display data D24-D27 stored in the shift register 31 are transferred to and stored in the display data register 60 at a fall of the enable signal EN.

Figure 11:
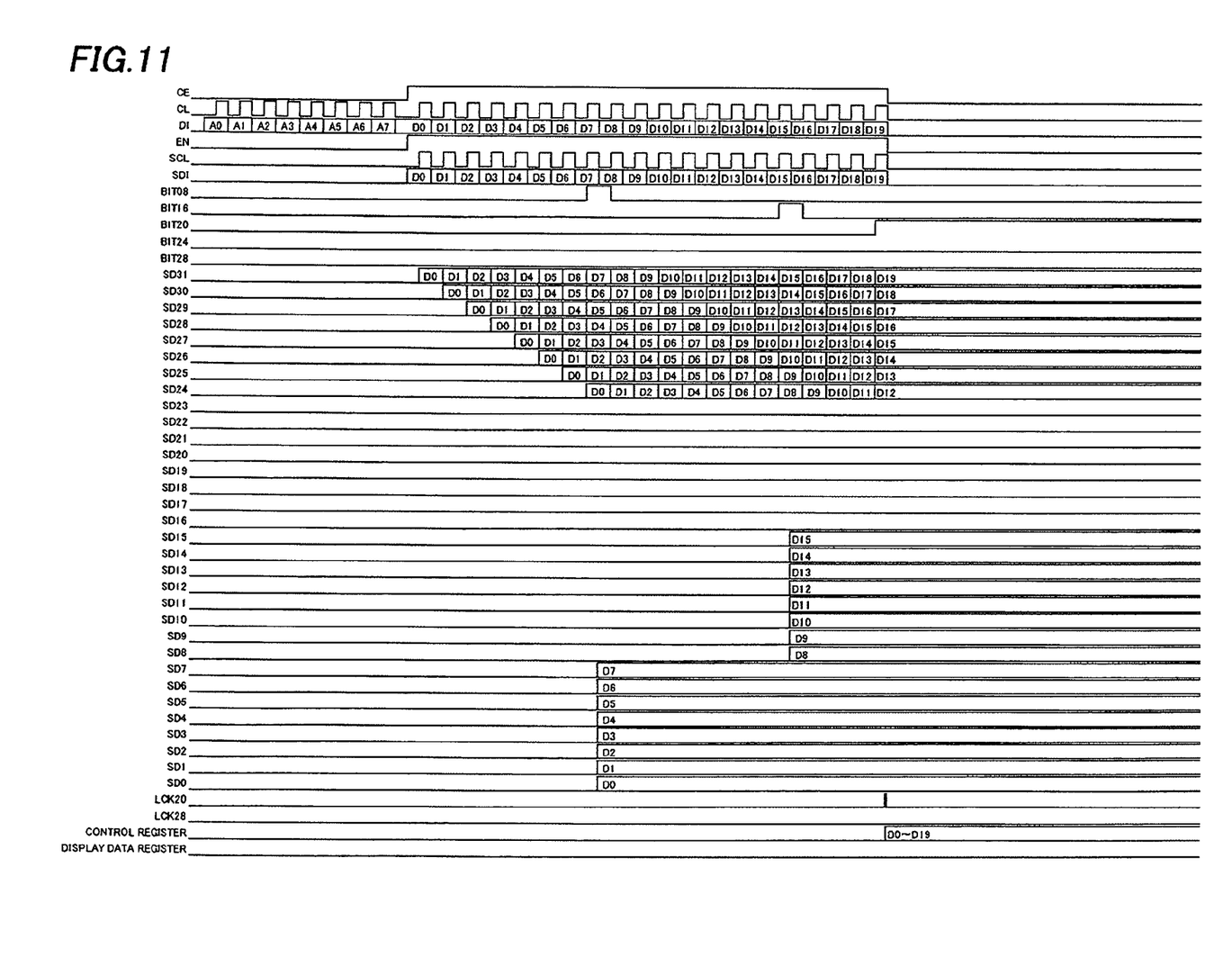
FIG. 11 is a timing chart showing a second operation of the serial data input system according to the third embodiment of this invention.

Next, an operation of the serial data input system described above, in which 20 bits of the control data stored in the serial data input register 30 are transferred and stored into the control data register 70, will be explained referring to a timing chart shown in FIG. 11.

When the address data A0-A7 transferred from the microcomputer coincides with the inherent IC address data and the chip enable signal CE rises to the high level, the interface circuit 10 outputs the clock SCL and 20 bits of the control data D0-D19 are inputted to the serial data input register 30 in synchronization with the rise of the clock pulse of the clock SCL.

First, the control data D0-D7 is inputted to the shift register 31 in synchronization with the rise of the clock pulse of the clock SCL. When the counted number of the clock pulses of the clock SCL reaches eight, the clock count signal BIT08 turns to the high level and the control data D0-D7 is collectively transferred to and stored in the register 32A in synchronization with the fall of the clock pulse of the clock SCL. Next to the above, the control data D8-D15 is inputted to the shift register 31. When the counted number of the clock pulses of the clock SCL reaches 16, the clock count signal BIT16 turns to the high level and the control data D8-D15 is collectively transferred to and stored in the register 32B in synchronization with the fall of the clock pulse of the clock SCL. And finally, the control data D16-D19 is inputted to the shift register 31.

Because the counted number of the clock pulses of the clock SCL reaches 20 when all 20 bits of the control data D0-D19 are inputted to the serial data input register 30 as described above, the clock count signal BIT20 turns to the high level and the control data D0-D7 stored in the register 32A, the control data D8-D15 stored in the register 32B and the control data D16-D19 stored in the shift register 31 ate transferred to and stored in the control data register 70 at the fall of the enable signal EN.

The serial data input register 30 according to the first embodiment is used as the serial data input register in the third embodiment described above. Instead, the serial data input register 50 according to the second embodiment may be used as the serial data input register in the third embodiment when low operating frequency is good enough. As described above, when the registers to store various kinds of data are provided after the serial data input register 30 or 50, the data inputted to and stored in the serial data input register 30 or 50 can be transferred to and stored in the registers to store various kinds of data as long as the number of bits to be transferred to the following stage is equal to or less than the total number of bits of the serial data input register 30 or 50.

According to the serial data input system of this embodiment, the increase in the power consumption and the increase in the power supply noise can be suppressed even when the number of bits of the data to be serially transferred at a time increases, because only the first register fully operates in synchronization with the clock during the serial data input.

Also, the time and effort consumed in preventing the clock skew can be reduced, since only the first register that is fully provided with the clock needs to be considered intensely.

In addition, detecting errors in the data transfer is made possible, because the number of clock pulses of the clock is counted by the clock counter.

What is claimed is:

1. A serial data input system comprising:
    a first register that receives and shifts serially transferred data in synchronization with a clock so as to hold the serially transferred data;
    a clock counter that counts clock pulses of the clock and outputs a first clock count signal when the counted clock pulses reach a first predetermined number and outputs a second clock count signal when the counted clock pulses reach a second predetermined number greater than the first predetermined number;
    a second register that receives from the first register first data serially transferred to the first register in response to the first clock count signal; and
    a third register that receives directly from the first register second data serially transferred to the first register in response to the second clock count signal,
    wherein both the second register and the third register receive the first and second data, respectively, by parallel data transfer without reversing a state of either the first data or the second data,
    the first data is all the serially transferred data that is held by the first register at the time of the parallel data transfer to the second register, and
    the second data is all the serially transferred data that is held by the first register at the time of the parallel data transfer to the third register.

2. The serial data input system of claim 1, wherein the first register comprises a delay flip-flop circuit.

3. The serial data input system of claim 1, wherein the second register comprises a delay flip-flop circuit or a latch circuit.

4. The serial data input system of claim 2, wherein the second register comprises a delay flip-flop circuit or a latch circuit.

5. The serial data input system of claim 1, further comprising an interface circuit that outputs the serially transferred data and the clock to the first register only when serially transferred address data that is transferred ahead of the serially transferred data matches with inherent address data stored in the interface circuit.

6. The serial data input system of claim 1, wherein the serially transferred data comprises display data.

7. A serial data input system comprising:
a first register that receives and shifts serially transferred data in synchronization with a clock so as to hold the serially transferred data;
a clock counter that counts clock pulses of the clock and outputs a first clock count signal when the counted clock pulses reach a first predetermined number and outputs a second clock count signal when the counted clock pulses reach a second predetermined number greater than the first predetermined number;
a second register that receives from the first register first data serially transferred to the first register in response to the first clock count signal; and
a third register that receives directly from the first register second data serially transferred to the first register in response to the second clock count signal,
wherein both the second register and the third register receive the first and second data, respectively, by parallel data transfer without reversing a state of either the first data or the second data, and
the third register comprises a display data register that controls turning on and off of a whole display device or a control data register that controls an operation mode of a display driver.

8. A serial data input system comprising:
a first register that receives and shifts serially transferred data in synchronization with a clock so as to hold the serially transferred data;
a clock counter that counts clock pulses of the clock and outputs a first clock count signal when the counted clock pulses reach a first predetermined number and outputs a second clock count signal when the counted clock pulses reach a second predetermined number greater than the first predetermined number;
a second register that receives from the first register first data serially transferred the first register in response to the first clock count signal; and
a third register that receives directly from the first register second data serially transferred to the first register in response to the second clock count signal,
wherein both the second register and the third register receive the first and second data, respectively, by parallel data transfer without reversing a state of either the first data or the second data, and
the third register receives the first data directly from the second register.

* * * * *